(12) United States Patent
Nakano et al.

(10) Patent No.: US 6,503,363 B2
(45) Date of Patent: *Jan. 7, 2003

(54) SYSTEM FOR REDUCING WAFER CONTAMINATION USING FRESHLY, CONDITIONED ALKALINE ETCHING SOLUTION

(75) Inventors: Masami Nakano, Vancouver, WA (US); Michito Sato, Fukushima (JP); Brian D. West, Vancouver, WA (US)

(73) Assignee: SEH America, Inc., Vancouver, WA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/518,502

(22) Filed: Mar. 3, 2000

(65) Prior Publication Data

US 2002/0053402 A1 May 9, 2002

(51) Int. Cl.[7] .............................................. H01L 21/00
(52) U.S. Cl. .......................... 156/345.18; 156/345.11; 438/745; 216/93; 216/83; 137/571
(58) Field of Search ...................... 156/345, 345.11; 216/93, 83; 438/745; 137/571; 134/100.1

(56) References Cited

U.S. PATENT DOCUMENTS

| | | | | |
|---|---|---|---|---|
| 3,607,482 A | * | 9/1971 | Selm et al. ................... 156/19 |
| 3,661,660 A | * | 5/1972 | Wessells et al. ............... 156/14 |
| 3,705,061 A | * | 12/1972 | King ............................ 156/19 |
| 3,775,202 A | * | 11/1973 | Meek et al. ................... 216/86 |
| 3,855,141 A | * | 12/1974 | Ruff ........................... 252/79.2 |
| 3,999,564 A | * | 12/1976 | Pesek ......................... 134/57 R |
| 4,042,444 A | * | 8/1977 | Snyder ......................... 156/345 |
| 5,049,233 A | * | 9/1991 | Davis .......................... 156/345 |
| 5,275,691 A | * | 1/1994 | Fukuta et al. ................ 156/345 |
| 5,353,369 A | * | 10/1994 | Scarpa et al. ................ 392/441 |
| 5,512,129 A | * | 4/1996 | Brodalla et al. ................ 134/2 |
| 5,560,838 A | * | 10/1996 | Allies et al. .................. 216/93 |
| 5,804,090 A | * | 9/1998 | Iwasaki et al. ............... 216/99 |
| 5,980,771 A | * | 11/1999 | Cowan ......................... 216/93 |
| 5,985,165 A | * | 11/1999 | Fukuta et al. ................. 216/93 |
| 6,045,763 A | * | 4/2000 | Kehl et al. .................... 423/24 |
| 6,110,839 A | * | 8/2000 | Nakano et al. ............. 438/753 |

FOREIGN PATENT DOCUMENTS

| JP | 09129624 | 5/1997 |
|---|---|---|
| JP | 10310883 | 11/1998 |

OTHER PUBLICATIONS

*Chemical Etching of Silicon*, Journal of Electrochemical Society, vol. 107, No. 2, Feb. 1960, pp. 108–111.

* cited by examiner

Primary Examiner—Gregory Mills
Assistant Examiner—Michelle Crowell
(74) Attorney, Agent, or Firm—Alston & Bird LLP

(57) ABSTRACT

A system for conditioning an alkaline etching solution for reducing contamination in a silicon wafer etching process. The system includes a conditioning tank for mixing a conditioned alkaline etching solution, the conditioned alkaline etching solution including a conditioning chemical; a conditioning chemical introduction system configured to add the conditioning chemical to the conditioning tank; and a buffer tank for storing the conditioned basic etching solution before using the conditioned alkaline etching solution in an etching process.

50 Claims, 3 Drawing Sheets

SYSTEM FOR REDUCING WAFER CONTAMINATION USING FRESHLY, CONDITIONED ALKALINE ETCHING SOLUTION

TECHNICAL FIELD

The present invention provides a system for chemically conditioning an alkaline etching solution before etching wafers to inhibit the contamination of wafers during an etching process by metal contaminants in the solution.

BACKGROUND OF THE INVENTION

The production of silicon wafers for integrated circuit substrates requires the use of complex processes involving many mechanical and chemical steps. Achieving both an extremely smooth and flat wafer surface and a high degree of purity in the ultimate product are two of the most important concerns in the process. A flat surface is necessary to ensure good pattern transfer from a photomask or reticle to a wafer. Modern lithographic techniques may require sub-micron images to be projected onto the surface of a wafer from a photomask or a reticle. To focus such a small image on the wafer surface, the distance between the photomask or reticle and the wafer surface must be carefully controlled. Typically, the photomask or reticle pattern will be transferred to the wafer surface by an optical aligner such as a step-and-repeat projection aligner. A step-and-repeat projection aligner focuses a reticle pattern on only one portion of a wafer at a time. After a portion is exposed, the image field is stepped across the surface of the wafer, and exposure is repeated at each step. Any variations in the shape, or flatness, of the wafer surface across the surface of the wafer may cause problems in this process. For instance, variations in the wafer surface shape may result in a poor transfer of a reticle pattern if the image is not refocused between exposure fields. On the other hand, if the image is refocused after each step, throughput may be decreased due to the time expenditure of refocusing. Because wafer flatness is so important to integrated circuit fabrication, each step in the wafer production process must be designed with the goal of increasing or preserving wafer flatness.

Several general steps are used to produce silicon wafers from a single crystal ingot of silicon. First, individual wafers are sliced from the end of the ingot. Next, the edges of the wafer are shaped to reduce the incidence of chipping during normal wafer handling. After edge shaping, a lapping step is used to bring the wafers within a specified thickness tolerance, and to reduce bow and warp. The wafer typically has 1 micron or less variation in surface shape across its diameter after lapping. Each of these processes may contaminate or damage the wafer surfaces, so a wet etching step is performed to etch away the contaminated and damaged layer. Generally an acid etch using hydrofluoric and nitric acids is employed. In this process, the nitric acid attacks the silicon to form $SiO_2$, which is then dissolved by the hydrofluoric acid. A diluent such as water or acetic acid may be used to control the concentration of the rate-determining species to vary the etching rate. Acid etching is a predictable and well-characterized process, but offers poor control of wafer surface shape, and may cause surface shape variation on the order of 2 microns or greater. Thus, the flatness of the wafer may be reduced, possibly making the wafers unsuitable for some lithographic processes.

Alkaline etches are preferable to acid etches when more control over the wafer surface shape is desired. In an alkaline etching process, silicon wafers are immersed in a solution of a strong base such as sodium hydroxide. The silicon is oxidized by the hydroxide to form the water-soluble $SiO_3^{2-}$ ion, which is then removed from the wafer surface by dissolution into the etching solution. The sodium hydroxide etching process offers superior shape control over acidic etching processes, typically causing a surface shape variation of 1 micron or less. However, the sodium hydroxide etching process presents problems with contamination not encountered in the acidic process.

Minimizing contamination is always a concern in the wafer production process. Single crystal ingots from which individual wafers are cut are extremely pure, with a concentration of impurity atoms typically on the order of $10^{10}$ atoms/cm$^2$. Because the reliable performance of devices fabricated on silicon substrates is dependent upon the extremely high purity of the substrate, this purity level should be maintained throughout the wafer production process. Every processing step is a potential source of contamination. For instance, if contaminants are present in an etching solution, they may diffuse into the wafers during an etching process. Though many measures are taken to keep etching solutions as free of contaminants as possible, contaminants may enter the solution in several ways. One potential source of contaminants is the etching container itself. Etching containers, or baths, are generally constructed of stainless steel. Some of the solutions used in etching processes, such as the sodium hydroxide solution used for alkaline etches, can leach metals such as nickel from the steel walls of the baths. Furthermore, the acids or bases used to mix the etching solutions may contain some impurities. Any wafer immersed in these solutions may be contaminated by these impurities unless some mechanism is used to inhibit the contamination.

One way to inhibit the contamination of wafers in an etching process is to choose a process with a greater etch rate than the diffusion rate of the contaminants into the wafers. Acid etches have this advantage; the rate of etching of silicon in an $HF/HNO_3/HOAc$ solution is greater than the rate of nickel diffusion into silicon. Sodium hydroxide etching, however, occurs at a slower rate than the diffusion of nickel into silicon. Thus, wafers etched with sodium hydroxide are vulnerable to nickel contamination, and some method of inhibiting contamination must be used.

The contamination levels of wafers etched with a particular batch of etching solution tend to decrease as the batch is used for more etchings. For instance, high concentrations of nickel may be found in wafers that have been etched with a freshly-mixed solution of sodium hydroxide, while much lower concentrations of nickel may be found in wafers etched with well-used solutions. As a result, the earlier batches of wafers etched with a freshly-mixed etching solution may be unsuitable for use as substrates. This effect may lower system throughput and efficiency, as a portion of the total number of wafers processed with each batch of solution may not be useable due to contamination problems. Thus, it would be desirable to have a system for preventing the contamination of wafers with metal contaminants when using a freshly-mixed etching solution during an alkaline etching process.

SUMMARY OF INVENTION

One aspect of the invention provides a system for conditioning an alkaline etching solution for reducing contamination in a silicon wafer etching process. The system includes a conditioning tank for mixing a conditioned alkaline etching solution, the conditioned alkaline etching solution including a conditioning chemical; a conditioning chemical introduction system configured to add the conditioning chemical to the conditioning tank; and a buffer tank for storing the conditioned alkaline etching solution before using the conditioned alkaline etching solution in an etching process.

Another aspect of the present invention provides a system for conditioning an alkaline etching solution to reduce contamination in a silicon wafer etching process. The system comprises means for holding the alkaline etching solution while the alkaline etching solution is being conditioned, means for adding a conditioning chemical to the alkaline etching solution while the alkaline etching solution is in the holding means, and means for storing the alkaline etching solution after the conditioning chemical has been added to the alkaline etching solution.

DETAILED DESCRIPTION OF THE PREFERRED EMBODIMENTS

Figure 1:
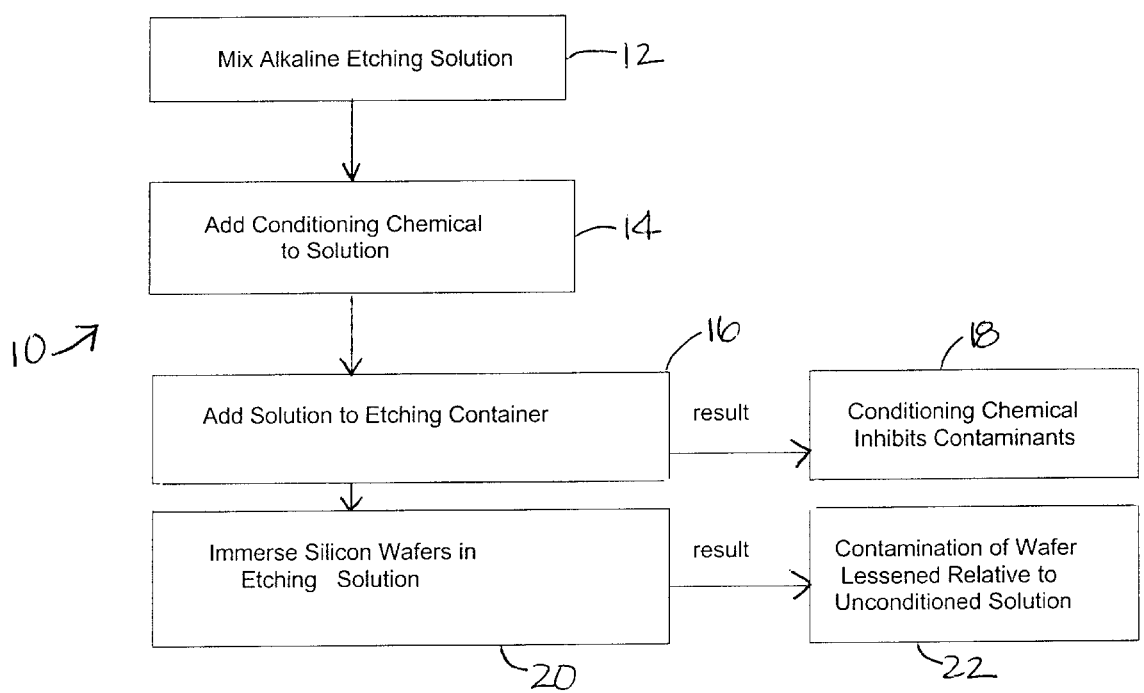
FIG. 1 is a flow diagram depicting a method of preventing contamination of a silicon wafer during etching according to an embodiment of the present invention.

The present invention provides a system for reducing the contamination of wafers during a wet etching step in the production of silicon wafers when using a fresh etching solution. It may be used in any process that employs an alkaline etching step. FIG. 1 shows generally at 10 a flow diagram of a method of reducing contamination according to the present invention. First, an alkaline etching solution is mixed at 12. Next, a conditioning chemical is added at 14. The conditioning chemical is a chemical that inhibits contaminants in the etching solution from contaminating wafers immersed in the solution. Next, the etching solution is added to an etching container at 16 in preparation for an etching process. Any impurities in the etching container may enter the etching solution at this point, and in the absence of a mechanism to prevent contamination, may then diffuse into wafers etched with the solution. However, the conditioning chemical provides this mechanism by inhibiting the contaminants, as shown at 18, before any wafers are etched in the solution 20. As a result, the contamination of wafers by contaminants in the etching solution is lessened relative to wafers etched in an unconditioned etching solution, as indicated at 22.

The alkaline etching solution mixed at 12 may be any suitable basic solution. Preferred solutions are solutions of strong hydroxide bases, and sodium hydroxide is a particularly preferred base. The concentration of base in the solution may be chosen to suit a particular etching application. Highly pure sodium hydroxide should be used so that as few contaminants as possible are introduced into the etching solution by the constituent chemicals. Examples of suitable sources of sodium hydroxide are Shin Etsu Chemical, Spec. >48%, industrial grade sodium hydroxide, and Ashland Chemical, Spec. >50%, electronic grade sodium hydroxide.

The conditioning chemical added at 12 generally will inhibit the contaminants by chemically reacting with the contaminants in some manner. In a preferred embodiment, the conditioning chemical inhibits metal contaminants by causing the chemical reduction of the contaminants to their elemental oxidation state, resulting in their precipitation out of the etching solution. Equation (1) represents this general process:

(1) $M^{n+} + R \text{ - - -} > M^0 + O$ where $M^{n+}$ is a cationic metal contaminant, R is a conditioning chemical that reduces metal contaminants, $M^0$ is the metal in its elemental oxidation state, and O is the oxidized conditioning chemical. This process can occur in several different ways. For instance, the conditioning chemical may directly reduce the contaminant, or it may react with other compounds in the solution to form an intermediate compound which then reduces the metal contaminants. The reducing agent, whether the conditioning chemical itself or the intermediate chemical, should have a lower oxidation potential than the reduction potential of the metal so the reduction process may be spontaneous, but an endothermic entropy-driven reduction may also be suitable.

The conditioning chemical may be used to reduce a variety of metal contaminants, including Al, Ca, Cr, Cu, Fe, Na and Zn, and Ni. Many sources exist for these contaminants. For instance, one source is the etching container itself. Metals such as nickel may be leached from the stainless steel walls of an etching container. This leached nickel may then react with the hydroxide ion in the etching solution to form the soluble $HNiO_2^-$ ion. Some $HNiO_2^-$ may precipitate onto the interior walls of the etching container, and some remains dissolved. As a result, an equilibrium concentration of dissolved nickel, represented by the following equation, is present in essentially all alkaline etching solutions in stainless steel containers:

(2) $Ni(s) + H_2O + OH^-(aq) <=> HNiO_2^-(aq) + H_2(g)$

The equilibrium concentration of $HNiO_2^-$ is sufficient to pose a significant threat of contamination to any wafers processed in the contaminated solution.

An example of a conditioning chemical that inhibits metallic contaminants in an etching solution is silicon. The dissolution of silicon into a basic solution produces hydrogen gas, as shown by the following equation:

(3) $Si(s) + 2OH^-(aq) + H_2O \text{ - - -} > SiO_3^{2-}(aq) + 2H_2(g)$

The hydrogen gas produced by this reaction may then reduce various metallic contaminants in the solution, thus lowering the equilibrium concentration of dissolved metal contaminants to lessen the contamination of wafers etched in the solution. Using nickel as an example, the process can be broken down into two steps. First, the hydrogen gas reduces the hydroxide ions, producing electrons available for a subsequent reduction:

(4) $2OH^-(aq) + H_2(g) \text{ - - -} > 2H_2O + 2e^-$      $E = +0.9\ V$

The electrons produced may then reduce $HNiO_2^-$ to precipitate elemental nickel:

(5) $HNiO_2^-(aq) + H_2O + 2e^- \text{ - - -} > Ni(s) + 3OH^-(aq)$      $E = -0.75\ V$ The given reaction potentials are relative to a standard hydrogen electrode. The oxidation potential of the reaction in equation (4) is greater than the reduction potential of the reaction in equation (5), so the reactions are spontaneous. Furthermore, a large excess of hydrogen gas is produced by dissolving silicon into the sodium hydroxide solution, driving the reactions given by equations (3) and (4) essentially to completion, and shifting the equilibrium of equation (2) further to the left. The end result is that more $HNiO_2^-$ is consumed and more nickel is precipitated out of the etching solution. Furthermore, the silicon and dissolved hydrogen gas in the solution will inhibit further dissolution of nickel into the etching solution from the sides of the container.

The silicon may be added to the etching solution by any suitable method. For instance, in an industrial scale etching process, silicon may be added to the etching solution from a hopper as a powder of either elemental silicon or of a silicate. The concentration of silicon in the resulting solution may be determined if the mass of silicon added and the volume of solution are known. The silicon also may be added to the solution by immersing wafers. In this case, the concentration of silicon in the solution can be calculated if the surface area of the wafers, the etching rate for a particular solution and wafer orientation, and the time for which the wafers are immersed are known. Whatever the method of adding the silicon, care must be taken to ensure that the silicon is highly pure so that no additional contaminants are added to the etching solution during mixing step 12. In the case of powdered silicon, electronic grade silicon should be used. In the case of wafers, the wafers should be rinsed at a rinsing station before being immersed in the etching solution.

In another embodiment of the invention, the conditioning chemical may directly reduce the contaminants. An example of such a compound is $Na_2S_2O_4$, or sodium dithionite. The dithionite ion is oxidized to the sulfite ion according to the following reaction:

$$(6)\ S_2O_4^{2-}+4OH^- \text{ - - - } >2SO_3^{2-}+2H_2O+2e^- \qquad E=+1.1\ V$$

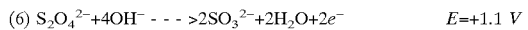

$HNiO_2^-$ may then be reduced according to equation (5) by the electrons produced in the oxidation half-reaction. While $Na_2S_2O_4$ and silicon are preferred conditioning chemicals, other suitable reducing agents, such as hydrophosphites, boron hydride compounds, aldehydes, hydrazine compounds or hydrogen gas, may also be used.

Figure 2:
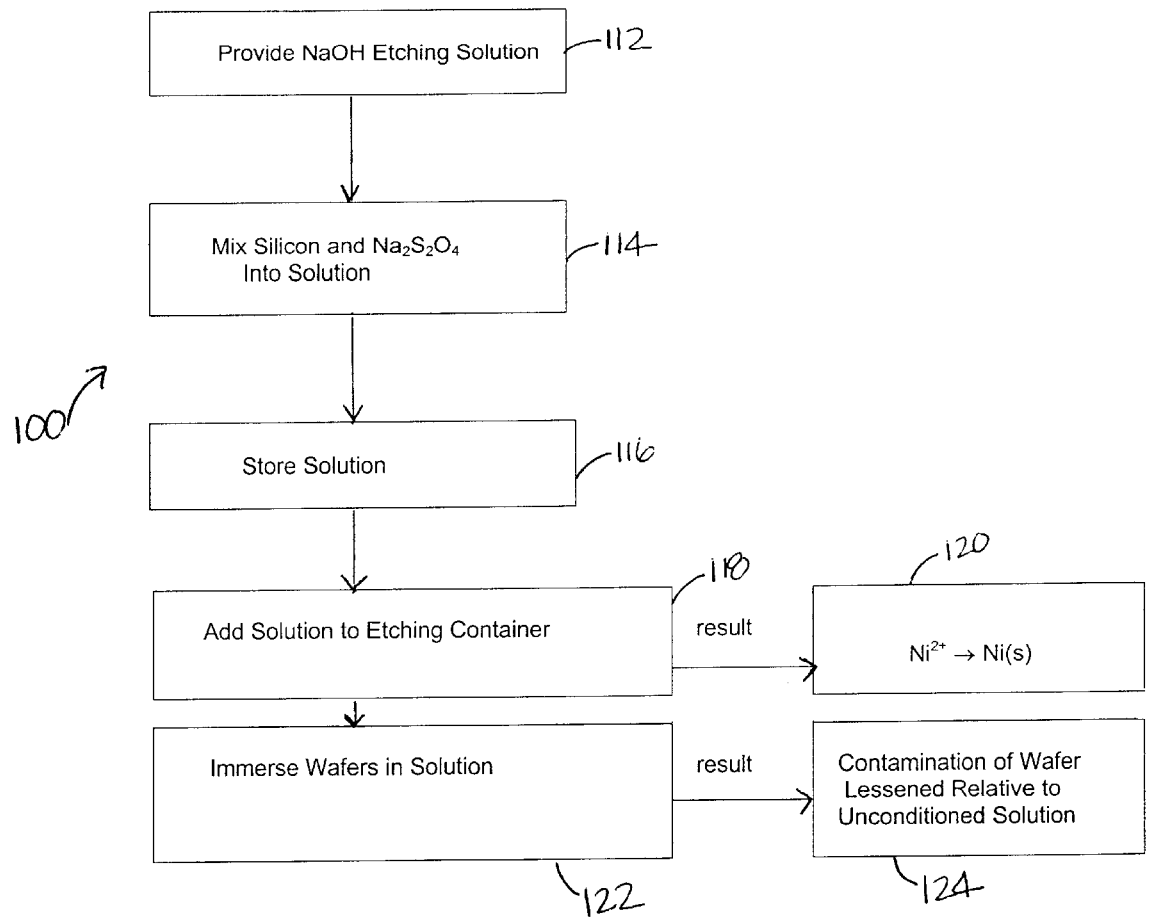
FIG. 2 is a flow diagram depicting a method of preventing contamination of a silicon wafer during etching according to another embodiment of the present invention.

In another embodiment of the present invention, more than one conditioning chemical may be added to an etching solution. The chemicals may be added in combination for different reasons. For instance, each chemical may control a different contaminant. Also, two or more conditioning chemicals may be added to produce a greater inhibiting effect for a single contaminant than either conditioning chemical may have alone. FIG. 2 illustrates an example of a process of controlling contamination by this embodiment. A basic etching solution, here a sodium hydroxide solution, is provided at 112. Next, a combination of silicon and $Na_2S_2O_4$ is added to the solution at 114. Both are added to the solution to suppress nickel contamination. By providing two mechanisms for the reduction of nickel, the likelihood that wafers immersed in the solution will be contaminated may be further reduced. Next, the conditioned solution may be stored, either off-site or on-site, before it is used in a process, as shown at 116. In this manner, the etching solution may be conditioned at any time prior to use so that it may be employed at 118 whenever needed without any delay, increasing the overall efficiency of the etching processes. After the mixing 114 and storing 116 steps, steps 118, 120, 122 and 124 proceed in a similar fashion to steps 16, 18, 20 and 22 in FIG. 1.

Table 1 summarizes the results of a conditioning experiment in which the effects of conditioning the alkaline etching solution for use in an alkaline etching process were measured. A solution of 50% NaOH was prepared, and several different combinations of conditioning chemicals were added. First, etching solutions were prepared over a range of different concentrations of dissolved silicon with no $Na_2S_2O_4$, and then solutions of the same concentrations of dissolved silicon were prepared with 8.22 g/L of $Na_2S_2O_4$. Silicon wafers were etched in each solution at 70 degrees Celsius, and then annealed above room temperature for 20 minutes. Samples were extracted from the surface and analyzed using vapor phase decomposition graphite furnace atomic absorption spectroscopy (VPDGFAAS). Reported nickel and iron contamination concentrations are the average value of two measurements. Negative values for measured contaminant concentrations indicate that the concentration of contaminants is below the instrument detection limit.

TABLE 1

| $[Na_2S_2O_4]$ (g/L) | $[Si]$ (g/L) | Fe Concentration ($\times 10^{10}$ atoms/cm$^2$) | Ni Concentration ($\times 10^{10}$ atoms/cm$^2$) |
|---|---|---|---|
| 0.00 | 0.00 | 0.63 | 40.40 |
| 0.00 | 0.93 | 0.98 | 40.40 |
| 0.00 | 2.93 | 0.00 | 11.22 |
| 0.00 | 4.82 | −0.06 | 1.37 |
| 0.00 | 9.36 | 0.00 | −0.09 |
| 8.22 | 0.00 | 0.29 | −0.13 |
| 8.22 | 1.17 | 0.10 | −0.15 |
| 8.22 | 3.15 | 0.36 | −0.16 |
| 8.22 | 5.18 | 1.03 | −0.28 |
| 8.22 | 9.09 | 0.56 | −0.14 |

Table 2 summarizes the results of a conditioning experiment in which the same procedure was followed as for the data of Table 1, with the additional step of a an acid etch after the alkaline etch and before the anneal. The acid etching solution comprised a mixture of acetic acid, hydrofluoric acid, nitric acid and water. The acid etching solution also included 6.0 g of dissolved silicon per liter of etching solution. Reported nickel and iron contamination concentrations are the average value of two measurements, except where indicated by an asterisk, where only a single measurement is reported.

TABLE 2

| $[Na_2S_2O_4]$ (g/L) | $[Si]$ (g/L) | Fe Concentration ($\times 10^{10}$ atoms/cm$^2$) | Ni Concentration ($\times 10^{10}$ atoms/cm$^2$) |
|---|---|---|---|
| 0 | 0 | 2.16 | 0.20 |
| 0 | 0.93 | 0.65 | −0.12 |
| 0 | 2.98 | 0.41 | −0.10 |
| 0 | 4.82 | 0.27 | 0.00 |
| 0 | 9.36 | 0.23 | −0.29 |
| 8.22 | 0 | −0.03* | 0.03* |
| 8.22 | 1.17 | 0.02 | −0.21 |
| 8.22 | 3.16 | 0.04 | −0.15 |
| 8.22 | 5.18 | 0.06 | −0.09 |
| 8.22 | 9.09 | 0.08 | 0.36 |

The data in Tables 1 and 2 show that nickel and iron contamination can be lessened by adding silicon, $Na_2S_2O_4$, or a combination of the two to an alkaline etching solution. Furthermore, the results show that either adding greater than 5 g of silicon per liter of etching solution or adding 8.22 g/L of $Na_2S_2O_4$ to the solution generally reduces the nickel contamination levels of the wafers to below $10^{10}$ atoms/cm$^2$ of silicon.

Figure 3:
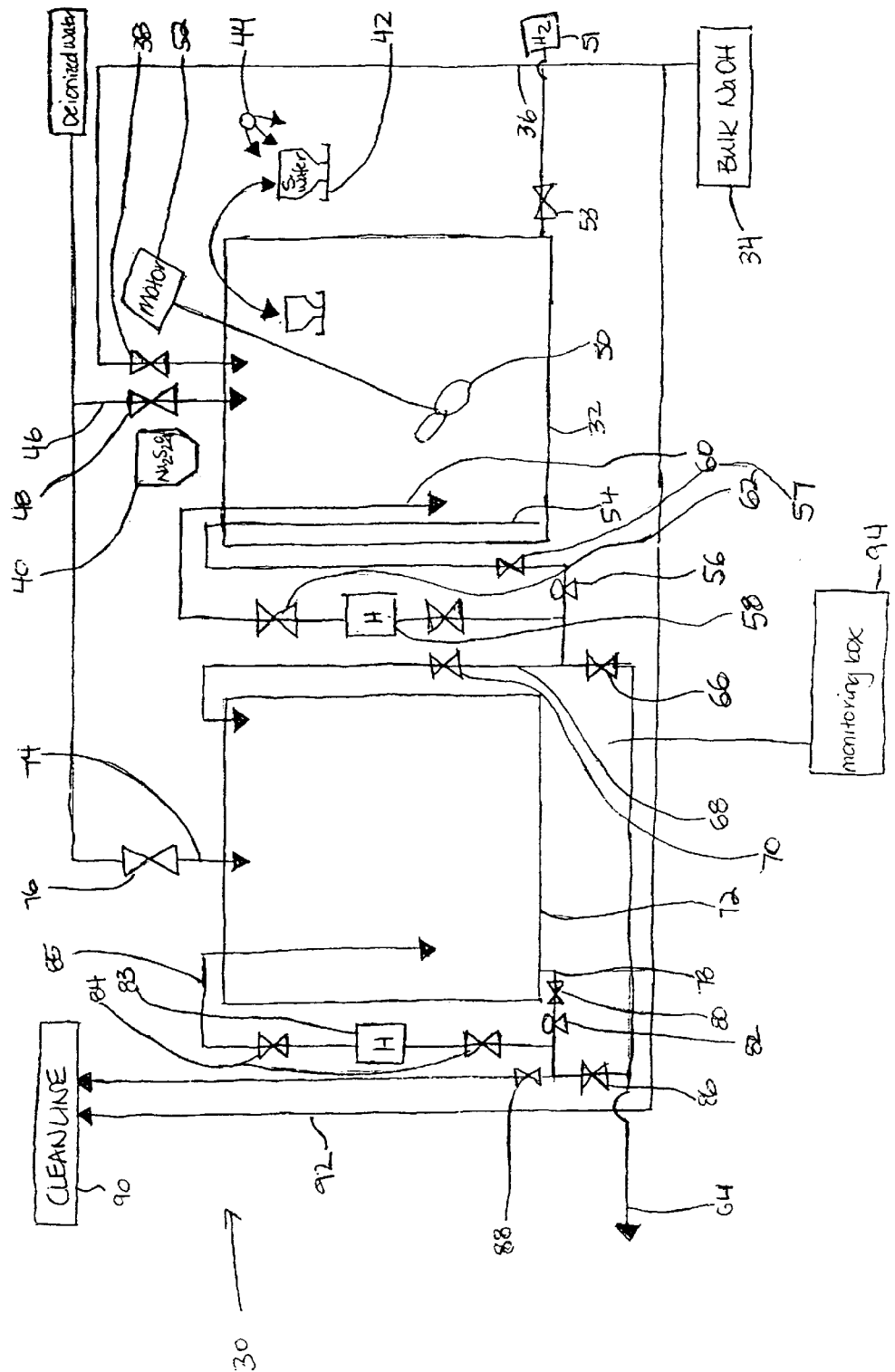
FIG. 3 is a schematic diagram of an etching solution conditioning system according to an embodiment of the present invention.

The method of the present invention is suitable for use in large-scale silicon wafer production processes. FIG. 3 shows generally at 30 a schematic of a system that may be used to provide a conditioned etching solution to a remote clean line. System 30 includes a conditioning tank 32 in which the etching solution is mixed and conditioned. For an industrial scale etching operation, tank 32 is preferably constructed of stainless steel and has a volume of approximately 100 liters, depending upon the amount of etching solution required by the clean line etching processes. A base such as bulk sodium hydroxide 34 is added to conditioning tank 32 through pipe 36. The flow of sodium hydroxide through pipe 36 is controlled by valve 38.

Different sources for the conditioning chemical may be used in system 30. For instance, a hopper 40 may be included for introducing a conditioning chemical, such as $Na_2S_2O_4$ in powder form. Additional hoppers may be included if more than one powdered conditioning chemical is to be added to conditioning tank 32. If silicon is to be added to conditioning tank 32 in wafer form, a wafer cassette system 42 may be used to lower wafers into conditioning tank 32. A cassette rinse station 44 may be included for rinsing wafer cassette 42 before it is lowered into conditioning tank 42 to remove contaminants from the surfaces of the wafers held in cassette 42. Any suitable type of rinse station may use any standard rinsing method, including a shower rinser or a dump rinser. Deionized water may be added to conditioning tank 32 through line 46, and the flow may be controlled by valve 48. The solution may be mixed in conditioning tank 32 with a mixer 50 driven by motor 52. Additionally, a gas source 51 may be included to add a gaseous reductant such as hydrogen to the conditioning tank through valve 53.

Conditioning tank 32 also includes an outlet pipe 54. Etching solution may be drawn out of conditioning tank 32 through outlet pipe 54 by pump 56. A preferred pump is a Yamada BP-20 pump. Flow through pump 56 may be controlled by valve 57. Etching solution drawn out of conditioning tank 32 may be directed to several different paths by manipulating the appropriate valves. First, the etching solution may be withdrawn for heating to ensure that all of its constituent chemicals are fully dissolved, and to increase the dissolution rate of the conditioning wafers in cassette 42. Heating the solution is performed by withdrawing solution from conditioning tank 32, circulating it through a standard heater 58 such as a 3 kW line heater, and then reintroducing it into conditioning tank 32 through pipe 60. The flow of the solution through heater 58 may be controlled by valves 62. Second, the etching solution may be discarded through drain pipe 64 by pumping the solution out of conditioning tank 32 through outlet 54 and through valve 66 into drain pipe 64. Finally, the conditioned etching solution may be transferred from conditioning tank 32 into a buffer tank 72 by directing the flow of the solution through pipe 68 by opening valve 70.

Buffer tank 72 provides for the storage of etching solutions between the conditioning process and use in a clean line etching process. Buffer tank 72 is preferably made from stainless steel and has a larger capacity than conditioning tank 32 so that it may hold the entire contents of conditioning tank 32 in addition to any solution already present in buffer tank 72. For a 100 L conditioning tank, a preferred buffer tank capacity is 300 L. Buffer tank 72 includes a deionized water inlet pipe 74. Flow through inlet pipe 74 is controlled by valve 76. Buffer tank 72 also includes an outlet pipe 78, through which flow is controlled by valve 80. Solution is drawn from buffer tank 72 through outlet pipe 78 by pump 82. A preferred pump is a Yamada BP-20 pump. Outflow from buffer tank 72 through pump 82 may be directed through valves 84 to flow through heater 83 and back into buffer tank 72 though pipe 85. Another valve 86 allows the contents of buffer tank 72 to be discarded through drain pipe 64. Finally, valve 88 allows the contents of buffer tank 72 to be supplied by pump 82 to an etching container on cleanline 90 through pipe 92. Finally, a monitor box 94 may be provided at which an operator may monitor and control system 30. Monitor box 94 may include indicators for pump conditions, flow sensors in the various pipes, pressure sensors in the tanks, and gas lines, and emergency cutoff switches.

Methods suitable for use with this system are disclosed in Japanese laid-open publication numbers 10-310883 and 09-129624, and in European Patent Office laid-open publication numbers 0864533 and 0761599. These publications are hereby incorporated by reference into this disclosure.

Industrial Applicability

This invention is applicable to semiconductor wafer etching processes, and is particularly applicable to conditioning an alkaline etching solution before etching wafers in the solution.

While the invention has been disclosed in its preferred form, the specific embodiments thereof as disclosed and illustrated herein are not to be considered in a limiting sense as numerous variations are possible. Applicants regard the subject matter of their invention to include all novel and non-obvious combinations and subcombinations of the various elements, features, functions and/or properties disclosed herein. No single feature, function, element or property of the disclosed embodiments is essential to all embodiments. The following claims define certain combinations and subcombinations which are regarded as novel and non-obvious. Other combinations and subcombinations of features, functions, elements and/or properties may be claimed through amendment of the present claims or presentation of new claims in this or a related application. Such claims, whether they are different, broader, narrower or equal in scope to the original claims, are also regarded as included within the subject matter of applicants' invention.

We claim:

1. A system for use in the conditioning of an alkaline etching solution used in silicon wafer production, wherein the system facilitates the decrease of metal contaminants from the etching solution by reduction of the metal contaminants to their elemental oxidation state, such system comprising:

a supply of fresh alkaline etching solution;

a supply of at least one conditioning chemical;

a conditioning tank in communication with said supply of fresh etching solution for mixing a conditioned alkaline etching solution, the conditioned alkaline etching solution including said fresh alkaline etching solution and said at least one conditioning chemical;

a conditioning chemical introduction system in communication with the conditioning tank configured to add the at least one conditioning chemical to the conditioning tank; and a buffer tank having an inlet in communication with the conditioning tank and an outlet in communication with an etching apparatus, said buffer tank capable of storing the conditioned alkaline etching solution before the conditioned alkaline solution is used in an etching process, wherein the system is configured such that conditioned etching solution is supplied to the etching apparatus without recycling etching solution to the system from the etching apparatus.

2. The system of claim 1, wherein the conditioning tank includes a mixer.

3. The system of claim 1, wherein the conditioning tank includes a heating system.

4. The system of claim 1, wherein the conditioning tank is stainless steel.

5. The system of claim 1, wherein the conditioning chemical is $Na_2S_2O_4$.

6. The system of claim 1, wherein the conditioning chemical introduction system is a hopper.

7. The system of claim 1, wherein the conditioning chemical is silicon.

8. The system of claim 7, wherein the conditioning chemical is added in the form of a wafer, and wherein the conditioning chemical introduction system is a wafer cassette capable of disposing said wafer within said conditioning tank.

9. The system of claim 1, wherein the conditioning chemical is hydrogen gas.

10. The system of claim 1, wherein the buffer tank is stainless steel.

11. The system of claim 1, wherein the buffer tank includes a heating system.

12. The system of claim 1, further comprising a rinse system for rinsing the conditioning chemical before adding the conditioning chemical to the conditioning tank.

13. The system of claim 1, further comprising a monitor station.

14. The system of claim 1, further comprising a pump for pumping the conditioned alkaline etching solution.

15. The system of claim 14, wherein the pump is configured to pump the conditioned alkaline etching solution from the conditioning tank to the buffer tank.

16. The system of claim 14, further comprising an etching container for holding the conditioned alkaline etching solution while etching wafers.

17. The system of claim 16, wherein the pump is configured to pump the conditioned alkaline etching solution from the buffer tank to the etching container.

18. A system for use in the conditioning of an alkaline etching solution used in silicon wafer production, wherein the system facilitates the decrease of metal contaminants from the etching solution by reduction of the metal contaminants to their elemental oxidation state, the system comprising:
   means for supplying fresh alkaline etching solution;
   means for supplying at least one conditioning chemical;
   holding means in communication with the fresh alkaline supply means for holding the fresh alkaline etching solution while the fresh alkaline etching solution is being conditioned;
   chemical adding means in communication with said holding means for adding the at least one conditioning chemical to the alkaline etching solution while the alkaline etching solution is in the holding means; and
   storage means having an inlet in communication with said holding means and an outlet in communication with an etching apparatus, said storage means being capable of storing the alkaline etching solution after the conditioning chemical has been added to the alkaline etching solution,
   wherein the system is configured such that conditioned etching solution is supplied to the etching apparatus without recycling etching solution to the system from the etching apparatus.

19. The system of claim 18, further comprising a mixing means for mixing the conditioning chemical into alkaline etching solution while the alkaline etching solution is in the holding means.

20. The system of claim 18, further comprising at least one pumping means for pumping the alkaline etching solution.

21. The system of claim 20, wherein the at least one pumping means is disposed between the holding means and the storing means.

22. The system of claim 20, further comprising an etching means for etching wafers with the alkaline etching solution.

23. The system of claim 22, wherein the at least one pumping means is disposed between the storing means and the etching means.

24. The system of claim 18, further comprising at least one heating means to heat the alkaline etching solution.

25. The system of claim 24, wherein the at least one heating means heats the alkaline etching solution in the holding means.

26. The system of claim 24, wherein the at least one heating means heat the alkaline etching solution in the storing means.

27. The system of claim 1, wherein the supply of at least one conditioning chemical is a supply of at least one reducing agent selected from silicon, sodium dithionite ($Na_2S_2O_4$), hydrophosphates, boron hydride compounds, aldehydes, hydrazine compounds, and hydrogen gas.

28. The system of claim 1, further comprising an etching apparatus which receives conditioned alkaline etching solution from the buffer tank.

29. A system for use in the conditioning of an alkaline etching solution used in silicon wafer production, wherein the system facilitates the decrease of metal contaminants from the etching solution by reduction of the metal contaminants to their elemental oxidation state, such system comprising:
   a supply of fresh alkaline etching solution;
   a supply of silicon;
   a conditioning tank for mixing a conditioned alkaline etching solution, the conditioned alkaline etching solution including said fresh alkaline etching solution and silicon;
   a conditioning chemical introduction system configured to add silicon to the conditioning tank wherein the silicon is added in the form of a wafer, and wherein the silicon introduction system is a wafer cassette capable of disposing said wafer within said conditioning tank; and
   a buffer tank for storing the conditioned alkaline etching solution before the conditioned alkaline solution is used in an etching process.

30. A system for use in the conditioning of an alkaline etching solution used in silicon wafer production, wherein the system facilitates the decrease of metal contaminants from the etching solution by reduction of the metal contaminants to their elemental oxidation state, such system comprising:
   a supply of fresh alkaline etching solution;
   a supply of silicon conditioning chemical in the form of at least one wafer;
   a conditioning tank in communication with said supply of fresh etching solution for mixing a conditioned alkaline etching solution, the conditioned alkaline etching solution including said fresh alkaline etching solution and said at least one conditioning chemical;
   a wafer cassette in communication with the conditioning tank configured to dispose said conditioning chemical wafer within the conditioning tank; and a buffer tank in communication with the conditioning tank for storing the conditioned alkaline etching solution before the conditioned alkaline solution is used in an etching process.

31. The system of claim 30, wherein the conditioning tank includes a mixer.

32. The system of claim 30, wherein the conditioning tank includes a heating system.

33. The system of claim 30, wherein the conditioning tank is stainless steel.

34. The system of claim 30, wherein the buffer tank is stainless steel.

35. The system of claim 30, wherein the buffer tank includes a heating system.

36. The system of claim 30, further comprising a rinse system for rinsing the conditioning chemical before adding the conditioning chemical to the conditioning tank.

37. The system of claim 30, further comprising a monitor station.

38. The system of claim 30, further comprising a pump for pumping the conditioned alkaline etching solution.

39. The system of claim 38, wherein the pump is configured to pump the conditioned alkaline etching solution from the conditioning tank to the buffer tank.

40. The system of claim 38, further comprising an etching container for holding the conditioned alkaline etching solution while etching wafers.

41. The system of claim 40, wherein the pump is configured to pump the conditioned alkaline etching solution from the buffer tank to the etching container.

42. A system for use in the conditioning of an alkaline etching solution used in silicon wafer production, wherein the system facilitates the decrease of metal contaminants from the etching solution by reduction of the metal contaminants to their elemental oxidation state, the system comprising:

means for supplying fresh alkaline etching solution;

means for supplying a silicon conditioning chemical in wafer form;

holding means in communication with the fresh alkaline supply means for holding the fresh alkaline etching solution while the fresh alkaline etching solution is being conditioned;

chemical adding means in communication with said holding means for adding the at least one conditioning chemical to the alkaline etching solution while the alkaline etching solution is in the holding means; and storage means in communication with said holding means for storing the alkaline etching solution after the conditioning chemical has been added to the alkaline etching solution, wherein the means for adding the at least one conditioning chemical is a wafer cassette capable of disposing said conditioning chemical wafer within said conditioning tank.

43. The system of claim 42, further comprising a mixing means for mixing the conditioning chemical into alkaline etching solution while the alkaline etching solution is in the holding means.

44. The system of claim 42, further comprising at least one pumping means for pumping the alkaline etching solution.

45. The system of claim 42, wherein the at least one pumping means is disposed between the holding means and the storing means.

46. The system of claim 42, further comprising an etching means for etching wafers with the alkaline etching solution.

47. The system of claim 46, wherein the at least one pumping means is disposed between the storing means and the etching means.

48. The system of claim 42, further comprising at least one heating means to heat the alkaline etching solution.

49. The system of claim 48, wherein the at least one heating means heats the alkaline etching solution in the holding means.

50. The system of claim 48, wherein the at least one heating means heat the alkaline etching solution in the storing means.

* * * * *